US011252353B2

(12) United States Patent
Do et al.

(10) Patent No.: US 11,252,353 B2
(45) Date of Patent: Feb. 15, 2022

(54) ULTRA-LOW NOISE AMPLIFIER ADAPTED FOR CMOS IMAGING SENSORS

(71) Applicant: BAE Systems Imaging Solutions Inc., San Jose, CA (US)

(72) Inventors: Hung T. Do, San Jose, CA (US); Chenguang Gong, San Jose, CA (US); Alberto M. Magnani, Danville, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 125 days.

(21) Appl. No.: 16/626,471

(22) PCT Filed: Jun. 29, 2017

(86) PCT No.: PCT/US2017/039993
§ 371 (c)(1),
(2) Date: Dec. 24, 2019

(87) PCT Pub. No.: WO2019/005070
PCT Pub. Date: Jan. 3, 2019

(65) Prior Publication Data
US 2020/0228731 A1    Jul. 16, 2020

(51) Int. Cl.
*H04N 5/335*   (2011.01)
*H04N 5/357*   (2011.01)
(Continued)

(52) U.S. Cl.
CPC .............. *H04N 5/357* (2013.01); *H03F 1/26* (2013.01); *H03F 3/04* (2013.01); *H03F 3/45475* (2013.01);
(Continued)

(58) Field of Classification Search
CPC ........ H04N 5/357; H04N 5/376; H04N 5/378; H04N 5/2355; H04N 5/355;
(Continued)

(56) References Cited

U.S. PATENT DOCUMENTS

| 5,629,522 A | 5/1997 | Martin et al. |
| 9,374,545 B2 | 6/2016 | Fowler et al. |
| 2001/0012070 A1 | 8/2001 | Enod et al. |
| 2012/0320246 A1 | 12/2012 | Ikuma et al. |

(Continued)

OTHER PUBLICATIONS

EP Search Report, EP17915244.2, dated Feb. 15, 2021, 8 pages.
(Continued)

*Primary Examiner* — Kelly L Jerabek
(74) *Attorney, Agent, or Firm* — Gary McFaline; Calvin B. Ward

(57) ABSTRACT

A low-noise amplifier is disclosed. The amplifier includes a signal amplifier having an amplifier signal output, a first filter capacitor, a buffer amplifier having a buffer amplifier input and a buffer amplifier output; and a switching network. The first filter capacitor has first and second terminals. The second terminal is connected to a power rail. The amplifier signal output is connected to the buffer amplifier input by a first direct current path and the buffer amplifier output to the first terminal of the first filter capacitor by a second direct current path during a first time period. The amplifier signal output is connected directly to the first terminal of the first filter capacitor by a third direct current path during a second time period, and the amplifier signal output to the first terminal of the first filter capacitor through a resistor during a third time period.

15 Claims, 7 Drawing Sheets

(51) Int. Cl.
*H03F 1/26* (2006.01)
*H03F 3/04* (2006.01)
*H04N 5/378* (2011.01)
*H03F 3/45* (2006.01)

(52) U.S. Cl.
CPC ....... *H04N 5/378* (2013.01); *H03F 2200/294* (2013.01)

(58) Field of Classification Search
CPC .. H04N 5/35581; H04N 5/3559; H04N 5/374; H04N 5/3741; H04N 5/3745; H04N 5/37452; H03F 2200/294; H03F 1/26; H03F 3/04; H03F 3/45475; H03F 3/082; H03F 3/16; H03F 3/14
See application file for complete search history.

(56) References Cited

U.S. PATENT DOCUMENTS

| | | |
|---|---|---|
| 2014/0048683 A1 | 2/2014 | Soh et al. |
| 2014/0049291 A1* | 2/2014 | Soh ........................ H04N 5/378 327/94 |
| 2015/0076321 A1 | 3/2015 | Fowler et al. |

OTHER PUBLICATIONS

S. Kawahito, N. Kawai, "A Noise Calculation Model for High-Gain Column Amplifiers of CMOS Imaging Sensors," Proc. of SPIE-IS &T, vol. 5017, pp. 48-58, Santa Clara, Jan. 2003.
International Search Report, PCT/US2017/039993, dated Sep. 8, 2017, 10 pages.

* cited by examiner

ULTRA-LOW NOISE AMPLIFIER ADAPTED FOR CMOS IMAGING SENSORS

BACKGROUND

CMOS imaging sensors typically have a two-dimensional array of pixel sensors that are organized as a plurality of rows and columns. Each pixel sensor includes a photodiode that measures the light received by that pixel sensor during an exposure. Each pixel sensor in a given column is connected to a bit line by a gate in the pixel sensor. The signals on the bit line are amplified by a column amplifier during readout and the amplified samples are stored on sample and hold capacitors for further processing that provides a digital value representing the amount of light received by the pixel sensor during an exposure. Readout noise in the column amplifier and sample and hold circuitry poses challenges in reducing the overall noise in the digital value to a level that is significantly less than the signal that would be produced by a single photoelectron being added to the photocharge generated by the photodiode in the pixel sensor.

Prior art schemes for reducing the readout noise require large capacitors in the readout circuitry. Since there is typically one readout circuit per column, the total space needed to provide these capacitors significantly increases the area of the imaging array, and hence, the cost.

SUMMARY

The present invention includes a low-noise amplifier and an imaging array utilizing the same. The low-noise amplifier includes a signal amplifier having an amplifier signal output, a first filter capacitor, a buffer amplifier having a buffer amplifier input and a buffer amplifier output; and a switching network. The first filter capacitor has first and second terminals. The second terminal is connected to a power rail. The switching network connects the amplifier signal output to the buffer amplifier input by a first direct current path and the buffer amplifier output to the first terminal of the first filter capacitor by a second direct current path during a first time period. The switching network also connects the amplifier signal output directly to the first terminal of the first filter capacitor by a third direct current path during a second time period, and connects the amplifier signal output to the first terminal of the first filter capacitor through a resistor during a third time period.

In one aspect of the invention, the first time period precedes the second time period and the second time period precedes the third time period.

In another aspect of the invention, the buffer amplifier has a gain substantially equal to one.

In another aspect of the invention, the low-noise amplifier also includes a controller that measures a difference between the buffer amplifier input and buffer amplifier output, the controller causing the apparatus to switch from the first time period to the second time period when the difference is less than a predetermined threshold.

In another aspect of the invention, the first time period and the second time period are fixed.

In another aspect of the invention, the buffer amplifier output is disconnected from the first filter capacitor during the second time period and the third time period.

In another aspect of the invention, the signal amplifier includes a capacitive transimpedance amplifier with a gain greater than one.

The imaging array includes a readout line conductor, a plurality of pixel sensors, each pixel sensor is coupled to the readout line conductor in response to a word select signal, and a column amplifier connected to the readout line conductor. The column amplifier includes a signal amplifier having an amplifier signal output, a first filter capacitor, a buffer amplifier having a buffer amplifier input and a buffer amplifier output, and a switching network. The switching network connects the amplifier signal output to the buffer amplifier input by a first direct current path and the buffer amplifier output to the first terminal of the first filter capacitor by a second direct current path during a first time period. The switching network also connects the amplifier signal output directly to the first terminal of the first filter capacitor by a third direct current path during a second time period, and connects the amplifier signal output to the first terminal of the first filter capacitor through a resistor during a third time period.

In one aspect of the invention, the first time period precedes the second time period and the second time period precedes the third time period.

In another aspect of the invention, the buffer amplifier has a gain substantially equal to one.

In another aspect of the invention, the imaging array also includes a controller that measures a difference between the buffer amplifier input and buffer amplifier output, the controller causing the apparatus to switch from the first time period to the second time period when the difference is less than a predetermined threshold.

In another aspect of the invention, the buffer amplifier has a gain greater than one.

In another aspect of the invention, the first time period and the second time period are fixed.

In another aspect of the invention, the buffer amplifier output is disconnected from the first filter capacitor during the second time period and the third time period.

In another aspect of the invention, the signal amplifier includes a capacitive transimpedance amplifier with a gain greater than one.

DETAILED DESCRIPTION

Figure 1:
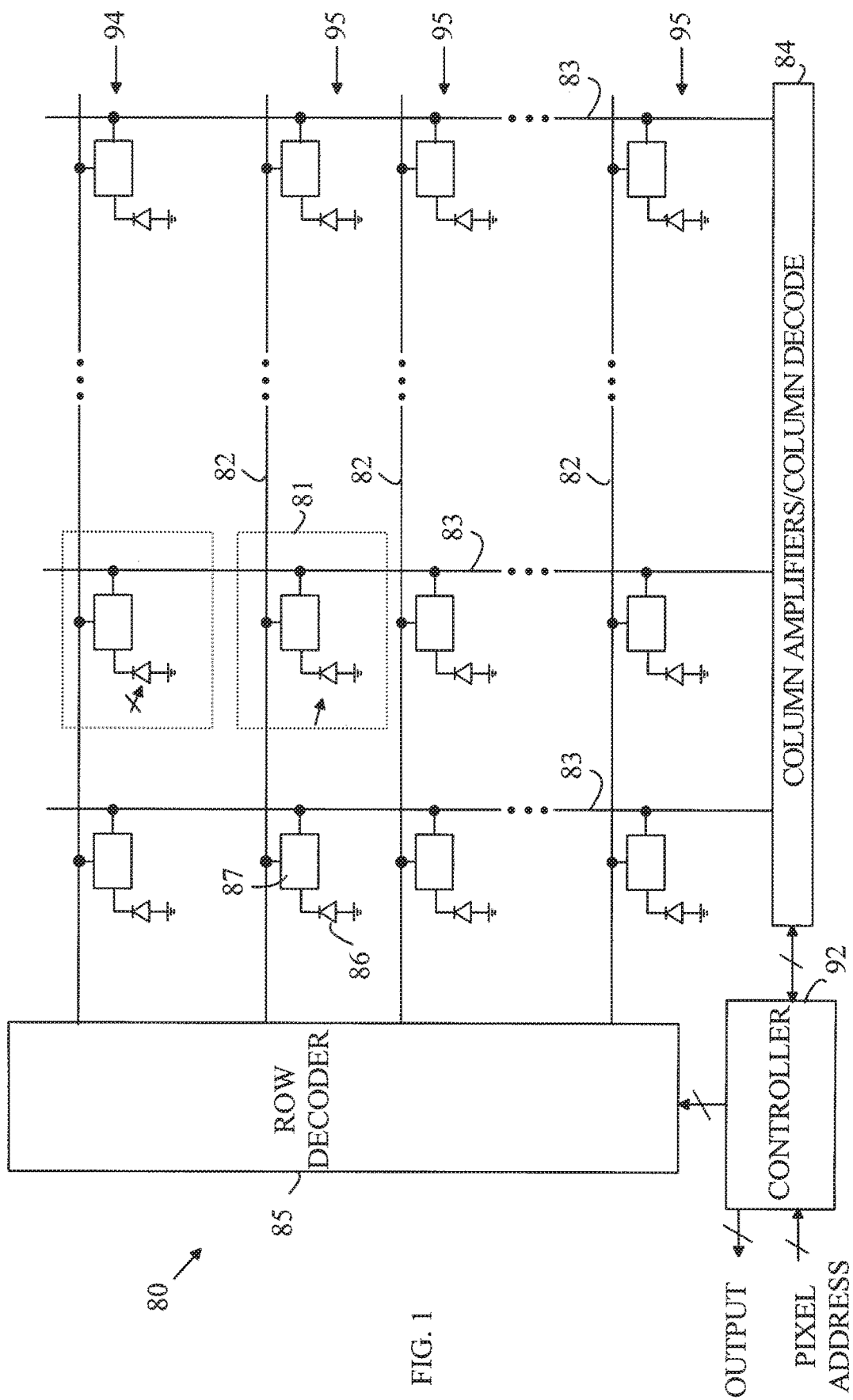
FIG. 1 illustrates a two-dimensional imaging array according to one embodiment of the present invention.
Figure 2:
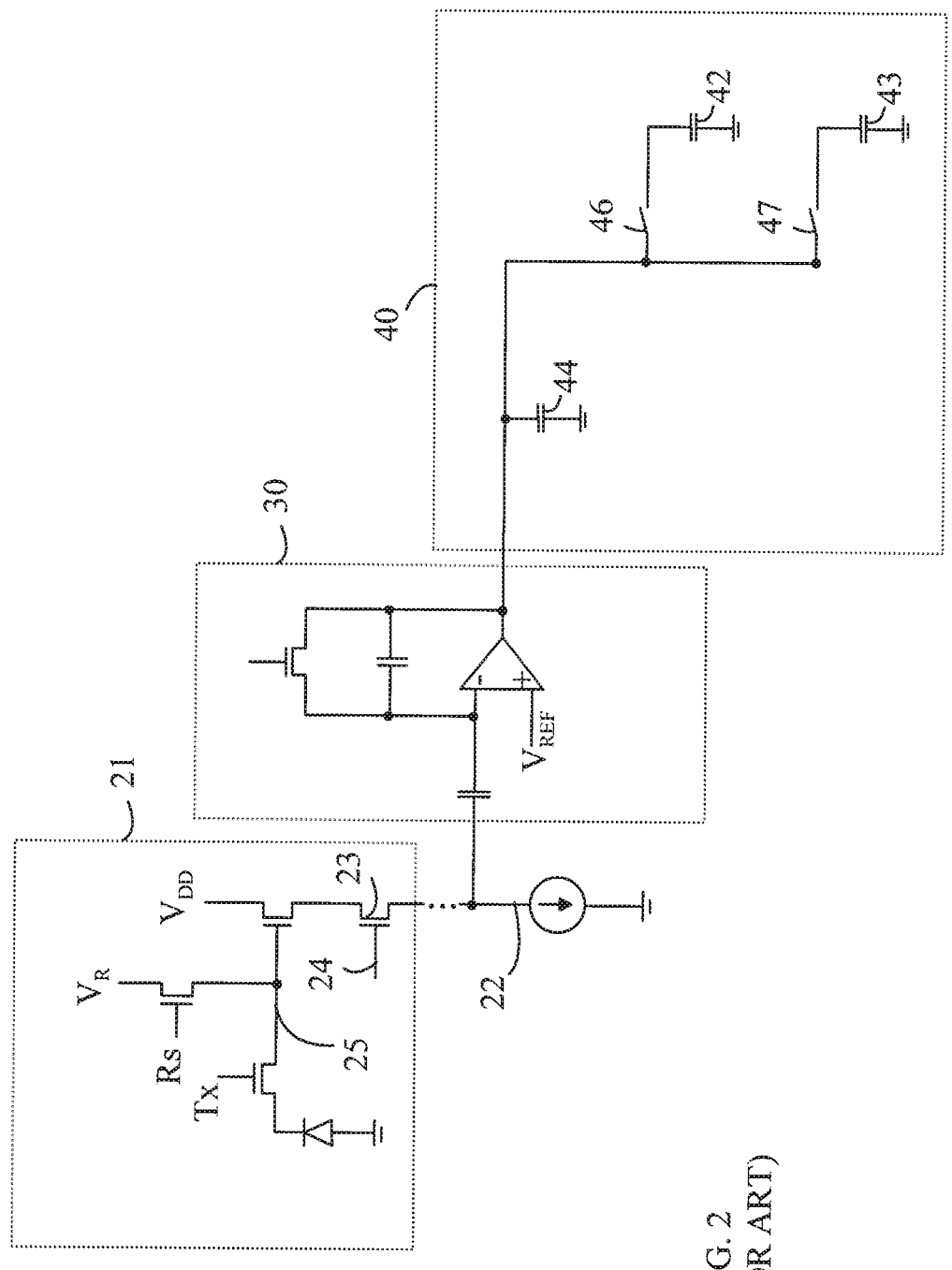
FIG. 2 illustrates one embodiment of a prior art column readout amplifier that suffers from readout noise problems.

The manner in which the present invention provides its advantages can be more easily understood with reference to FIGS. 1 and 2. FIG. 1 illustrates a two-dimensional imaging array according to one embodiment of the present invention. Rectangular imaging array 80 includes a pixel sensor 81. Each pixel sensor has a photodiode 86. The manner in which the pixel sensor operates will be discussed in more detail below. The reset circuitry and amplification circuitry in each pixel is shown at 87. The pixel sensors are arranged as a plurality of rows and columns. Exemplary rows are shown at 94 and 95. Each pixel sensor in a column is connected to a readout line 83 that is shared by all of the pixel sensors in that column. Each pixel sensor in a row is connected to a row select line 82 which determines if the pixel sensor in that row is connected to the corresponding readout line.

The operation of rectangular imaging array 80 is controlled by a controller 92 that receives a pixel address to be read out. Controller 92 generates a row select address that is used by row decoder 85 to enable the read out of the pixel sensors on a corresponding row in rectangular imaging array 80. The column amplifiers are included in an array of column amplifiers 84 which execute the readout algorithm, which will be discussed in more detail below. All of the pixel sensors in a given row are read out in parallel; hence there is one column amplification and analog-to-digital converter (ADC) circuit per readout line 83. The column processing circuitry will be discussed in more detail below.

When rectangular imaging array 80 is reset and then exposed to light during an imaging exposure, each photodiode accumulates a charge that depends on the light exposure and the light conversion efficiency of that photodiode. That charge is converted to a voltage by reset and amplification circuitry 87 in that pixel sensor when the row in which the pixel sensor associated with that photodiode is read out. That voltage is coupled to the corresponding readout line 83 and processed by the amplification and ADC circuitry associated with the readout line in question to generate a digital value that represents the amount of light that was incident on the pixel sensor during the imaging exposure.

Refer now to FIG. 2, which illustrates one embodiment of a prior art column readout amplifier that suffers from readout noise problems. To simplify the drawing only a single pixel sensor 21 from the column of pixel sensors serviced by transimpedance amplifier 30 is shown in the figure. When a pixel sensor such as pixel sensor 21 in the column depicted in FIG. 2 is to be read out, the pixel sensor is connected to the readout line 22 by causing gate 23 to be placed in the conducting state via a signal on word line 24. As will be explained in more detail below, the readout process involves a number of steps and measurements. For each measurement of the voltage from pixel sensor 21, the voltage on readout line 22 is amplified by transimpedance amplifier 30, and the resultant voltage is stored on a corresponding capacitor in sample and hold circuit 40. The amount of noise that can be transferred from transimpedance amplifier 30 to capacitors 42 and 43 depends on the pass band of the signal path from transimpedance amplifier 30 to the capacitors in question. To reduce the noise, a large capacitor 44 having a capacitance C4 is used to reduce the bandwidth of that path. However, the bandwidth of transimpedance amplifier 30 decreases when capacitor 44 is increased; hence, the time needed to charge such a large capacitor presents significant problems. In addition, the physical size of the capacitor significantly increases the size of the imaging array, since one such capacitor is needed for each column of pixel sensors.

Figure 3:
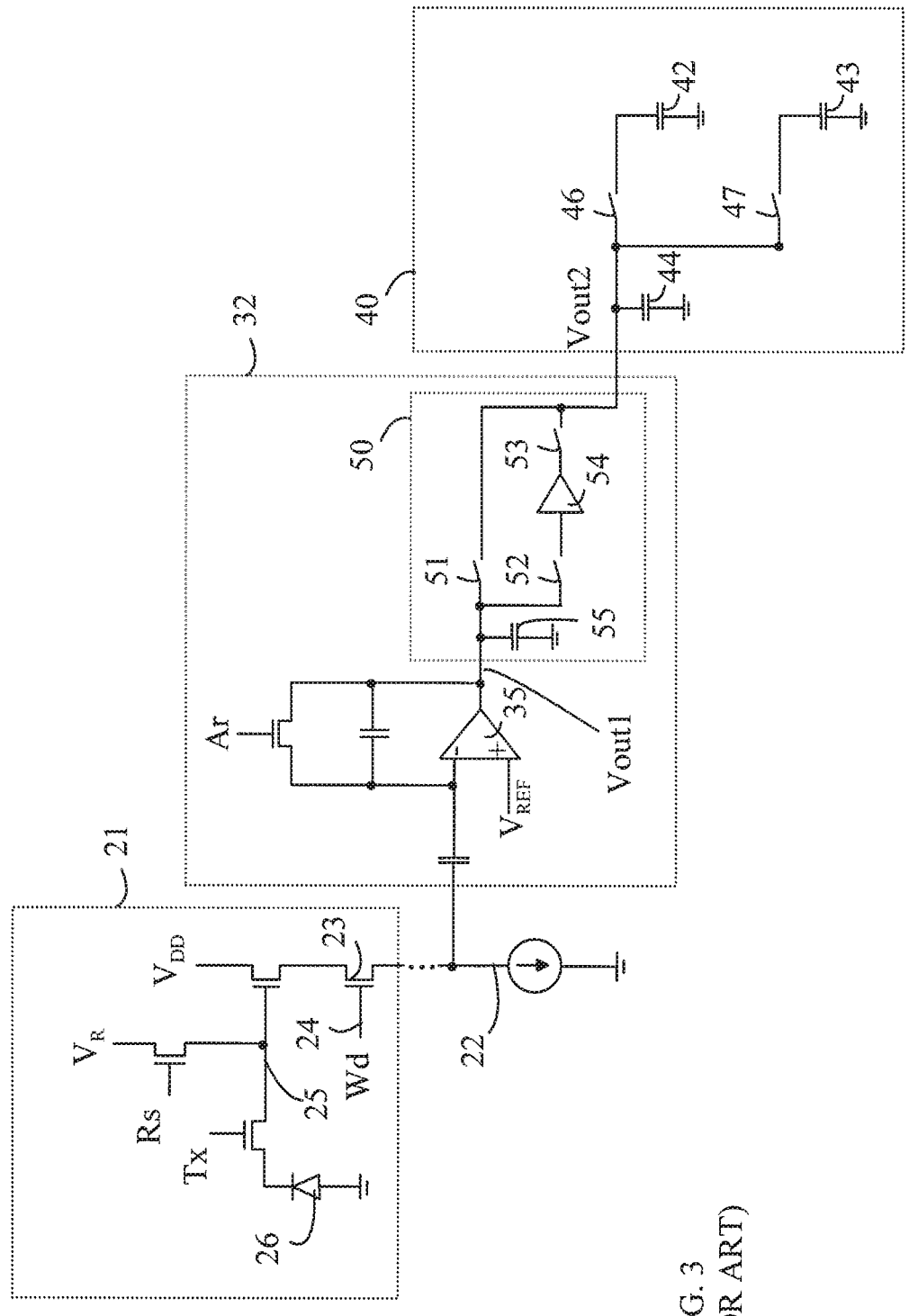
FIG. 3 illustrates another prior art column amplifier that reduces the charging time for capacitor 44.

Refer now to FIG. 3, which illustrates another prior art column amplifier that reduces the charging time for capacitor 44. Column amplifier 32 uses capacitor 55 to set the bandwidth of the transimpedance amplifier while using a large capacitor 44 to reduce the pass band of the signal path to the sample and hold capacitors. Column amplifier 32 differs from transimpedance amplifier 30 discussed above in that an initial charge circuit 50 that allows capacitor 44 to be charged to near the final output voltage is introduced between the output of amplifier 35 and capacitor 44. This circuit drives the voltage on capacitor 44 to a value near the output of the voltage of amplifier 35. However, the initial value achieved has a significant amount of noise that is introduced by buffer 54. The final value is then achieved by eliminating the noise generating elements and allowing capacitor 44 to reach the desired voltage via a low bandwidth path. Since the voltage difference between capacitor 44 and the output of amplifier 35 is greatly reduced, the time to reach equilibrium is reduced to an acceptable level.

The readout period for any given voltage on readout line 22 can be viewed as having two phases. In the first phase, switch 51 is open and switches 52 and 53 are closed. Buffer 54 charges capacitor 44 to a voltage near the output voltage. In this configuration, a substantial amount of noise can be present on the input to capacitor 44 due to noise from buffer 54. At the end of the first time period, switches 52 and 53 are opened and switch 51 is closed thereby connecting capacitor 44 directly to the output of amplifier 35 and re-establishing the low bandwidth path. Any remaining difference in voltage is then corrected via this low bandwidth path before the voltage is captured by sample and hold circuit 40.

Figure 4:
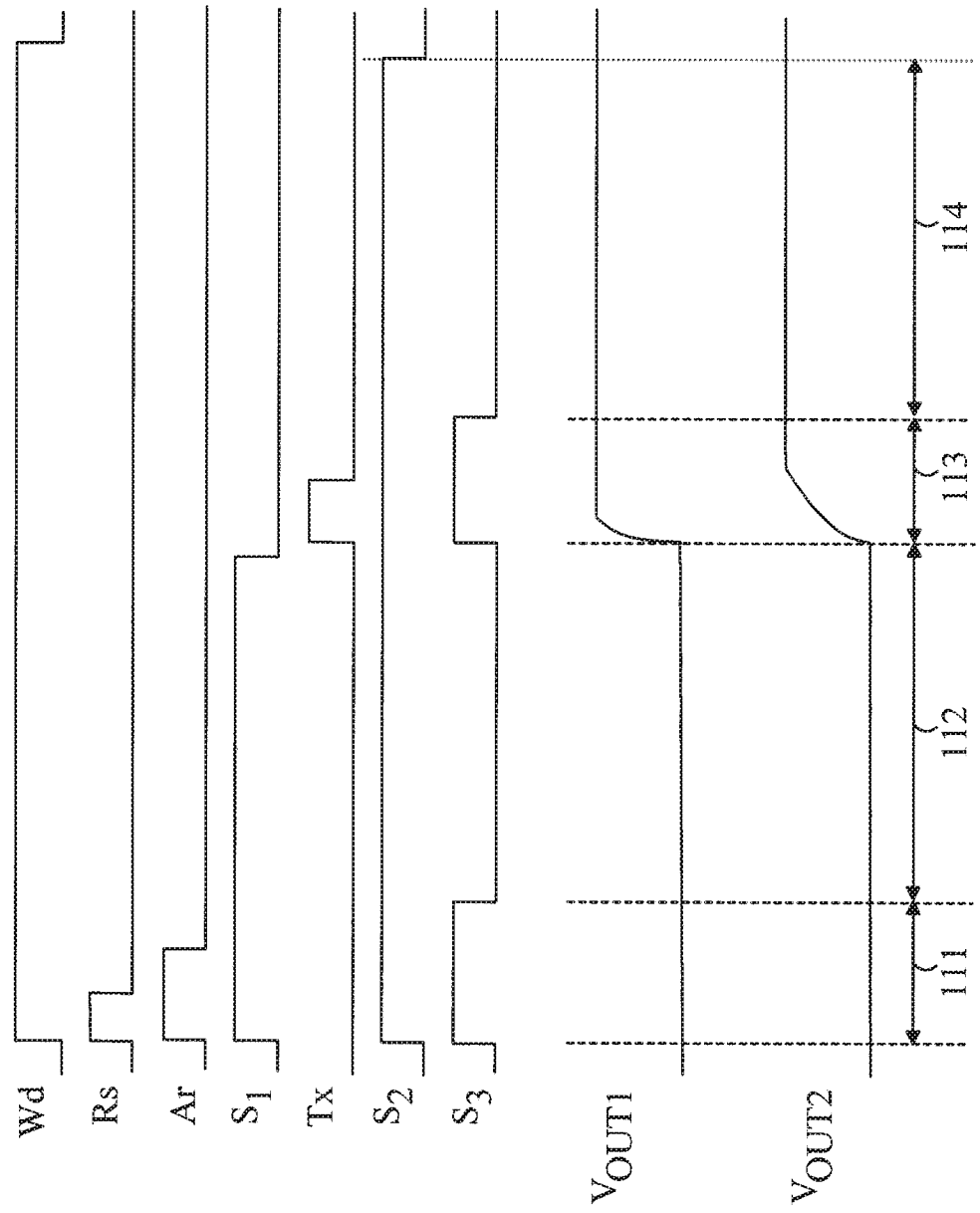
FIG. 4 illustrates a timing diagram for the readout scheme in a correlated double sampling imaging array using the column amplifier arrangement shown in FIG. 3.

A timing diagram for the readout scheme in a correlated double sampling imaging array using the column amplifier arrangement shown in FIG. 3 is shown in FIG. 4. In a correlated double sampling scheme, the voltage on the floating diffusion node 25 is reset to $V_R$ by raising reset signal Rs. The voltage after reset is captured on capacitor 42. The charge on the photodiode is then transferred to floating diffusion node 25 and the voltage on floating diffusion node 25 is captured on capacitor 43. The difference in the captured voltages is a measure of the photocharge that was stored on photodiode 26. Each of these voltage capture steps that can be viewed as taking place in two phases. In the first phase, capacitor 44 is charged to a voltage that is close to that of the output of amplifier 35 by buffer 54. In the second phase, noise and the remaining discrepancy between the voltage on the output of amplifier 35 and capacitor 44 are removed by disconnecting buffer 54 and connecting capacitor 44 to the output of amplifier 35 via the low bandwidth path through switch 51.

Switches 46 and 47 are controlled by signals $S_1$ and $S_2$, each switch being closed by the corresponding signal going HIGH. Switches 51-53 are controlled by a signal $S_3$. Switches 52 and 53 are closed by $S_3$ going HIGH, and switch 51 is closed by $S_3$ going LOW. In a correlated double sampling scheme, the voltage on the floating diffusion node 25 is reset to $V_R$ by raising reset signal Rs. The voltage after reset is captured on capacitor 42. This measurement is accomplished in two phases. In phase 111, the buffer 54 is activated and used to precharge capacitor 44. The period is set by closing switches 52 and 53. As noted above, this period is characterized by a high level of noise. At the end of the first period, switches 52 and 53 are opened and switch 51 is closed. Referring to FIG. 4, the row of pixel sensors being read out is determined by word line Wd going HIGH at the beginning of phase 111. Floating diffusion node 25 is reset to $V_R$ by pulsing Rs and amplifier 35 is reset by pulsing Ar. Switches 46 and 47 are also closed at the beginning of phase 111 by bringing $S_1$ and $S_2$ HIGH. During phase 111, switches 52 and 53 are closed and buffer 54 is connected to capacitor 44. During phase 111, the signal on capacitor 44, $V_{out2}$, has a high level of noise and may be offset from the voltage at the output of amplifier 35. At the end of phase 111, switches 52 and 53 are opened, and switch 51 is closed. This begins phase 112. During phase 112, the connection between amplifier 35 and capacitor 44 is characterized by a much lower bandwidth than during phase 111. Hence, phase 112 is characterized by low noise. At the end of phase 112, the voltage on capacitor 44 will have stabilized and any buffer offset voltage eliminated. The voltage on capacitor 44 is then captured on capacitor 42 by opening switch 46. At this point, the voltage on floating diffusion node 25 is captured on capacitor 42.

The capture of the voltage on floating diffusion node 25 after the charge on photodiode 26 is transferred proceeds in two analogous phases, referred to as phases 113 and phase 114 in FIG. 4. Phase 113 starts with the transfer of the photocharge to floating diffusion node 25 by pulsing Tx HIGH. Phases 113 and 114 are analogous to phases 111 and 112 discussed above, and hence, will not be discussed in detail. At the end of phase 114, switch 47 is opened, thus capturing the second voltage level on capacitor 43.

Implementing the scheme shown in FIGS. 3 and 4 poses two challenges. First, to provide the desired low bandwidth, the size of capacitor 44 needs to be quite high. In one exemplary embodiment, the capacitance of capacitor 44 needs to be about 120 pF to achieve a readout noise less than 0.3 electrons at a frame rate of five frames per second. One such capacitor is needed for each readout line, and hence, the capacitor must be constructed in a space that has the width of the pixel pitch in the horizontal direction. For a 4 micron pixel pitch, the length of the capacitor plates is about 5000 microns for an NMOS capacitor. The corresponding die size must be increased by about 5 mm to accommodate these large capacitors.

The second challenge relates to the buffer amplifier. To charge such a large capacitor in a reasonable time period, the buffer amplifier must be able to provide a significant current. This requirement increases the size of the buffer amplifier, and hence, further increases the size of the die and the power required to read out the imaging sensor.

Figure 5:
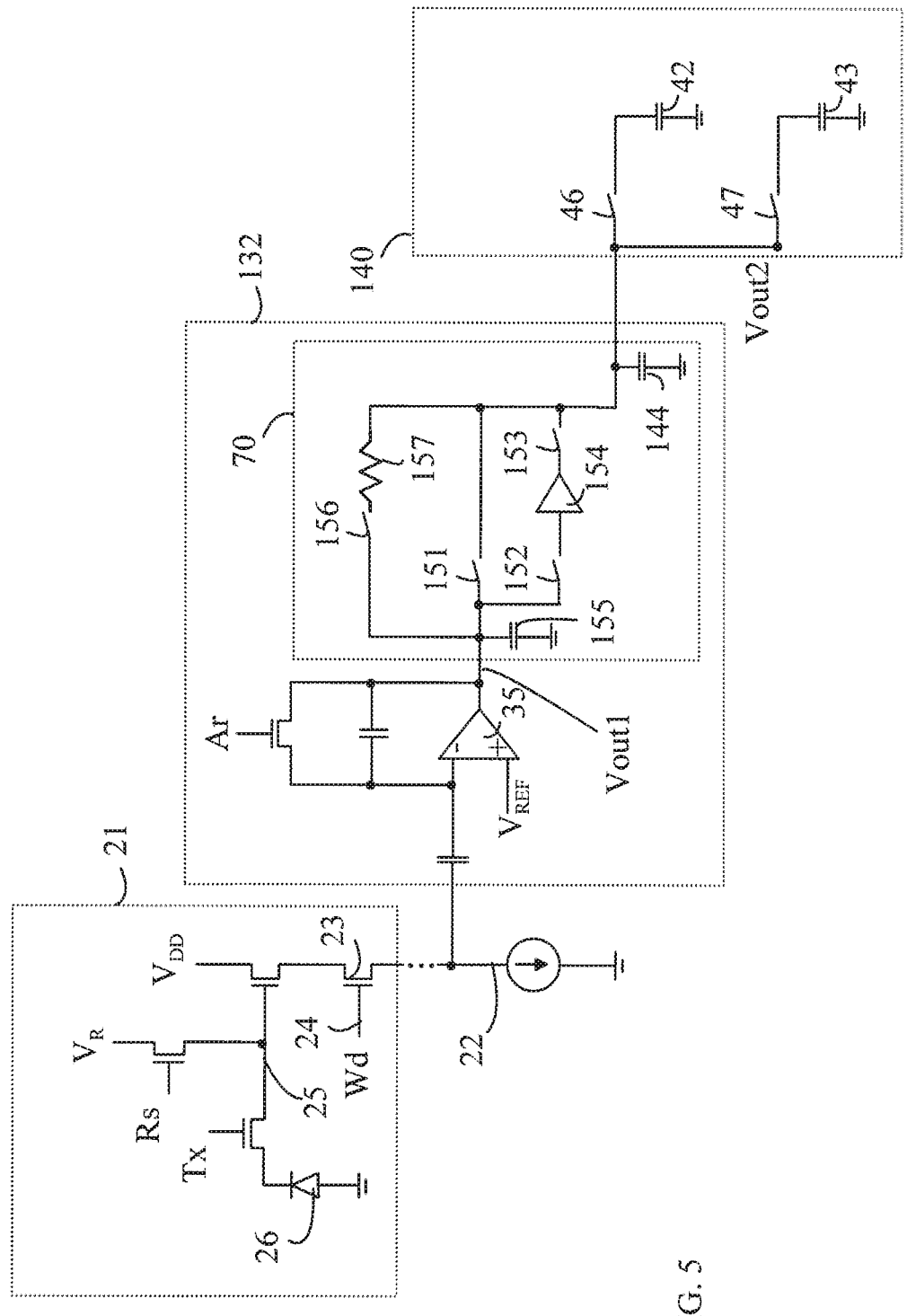
FIG. 5 illustrates a column amplifier according to one embodiment of the present invention.

The present invention overcomes these challenges by utilizing a low bandwidth connection that requires a smaller capacitor for capacitor 44 and introducing a third phase into the voltage measurements. Refer now to FIG. 5, which illustrates a column amplifier according to one embodiment of the present invention. Column amplifier 132 is similar to column amplifier 32 discussed above in that the output of the capacitive transimpedance amplifier that includes amplifier 35 is captured on a dual sample and hold circuit 140 after being filtered through a filter 70 having three states and a filter capacitor 144 that is analogous to capacitor 44 discussed above. As will be explained in more detail below, capacitor 144 can be a fraction of capacitor 44 and still provide the filtering needed to reduce the noise to less than 0.3 electrons. The read out of a voltage on readout line 22 by column amplifier 132 has three phases. In the first phase switches 152 and 153 are closed and switches 151 and 156 are open. Buffer 154 charges capacitor 144 to a voltage that differs from the output voltage of amplifier 35 by some small offset. Since the capacitance of capacitor 144 is a fraction of that of capacitor 44 discussed above, the required charging current is substantially reduced, and hence, a smaller buffer can be used. As noted above, during this phase $V_{out2}$ is characterized by a high level of noise as well as the offset from $V_{out1}$.

At the end of the first phase, switches 152 and 153, which are controlled by a signal $S_3$, are opened and switches 151 and 156 are closed. Switch 151 is controlled by a switch signal $S_4$, and switch 156 is controlled by $S_3$, however, switch 156 is closed when switch 152 and switch 153 are open and vice versa. During the second phase, any offset voltage on capacitor 144 relative to $V_{out1}$ is eliminated. However, since capacitor 144 is much smaller than capacitor 44 described above, $V_{out2}$ is characterized by a noise level that is between that of the first phase and the desired final low noise level.

At the end of the second phase, switch 151 is opened, leaving capacitor 144 connected to the output of amplifier 35 by a low-pass filter comprising resistor 157 and capacitor 144. In one exemplary embodiment, the capacitance of capacitor 144 is 20 pF and resistor 157 has a resistance of 1.2 MΩ. Since the area needed to construct the resistor is significantly less than that needed to provide the additional 100 pF, a net reduction in the space needed to construct the filter is obtained. Using conventional fabrication processes, the required area is reduced by approximately 75 percent while providing somewhat lower noise.

Figure 6:
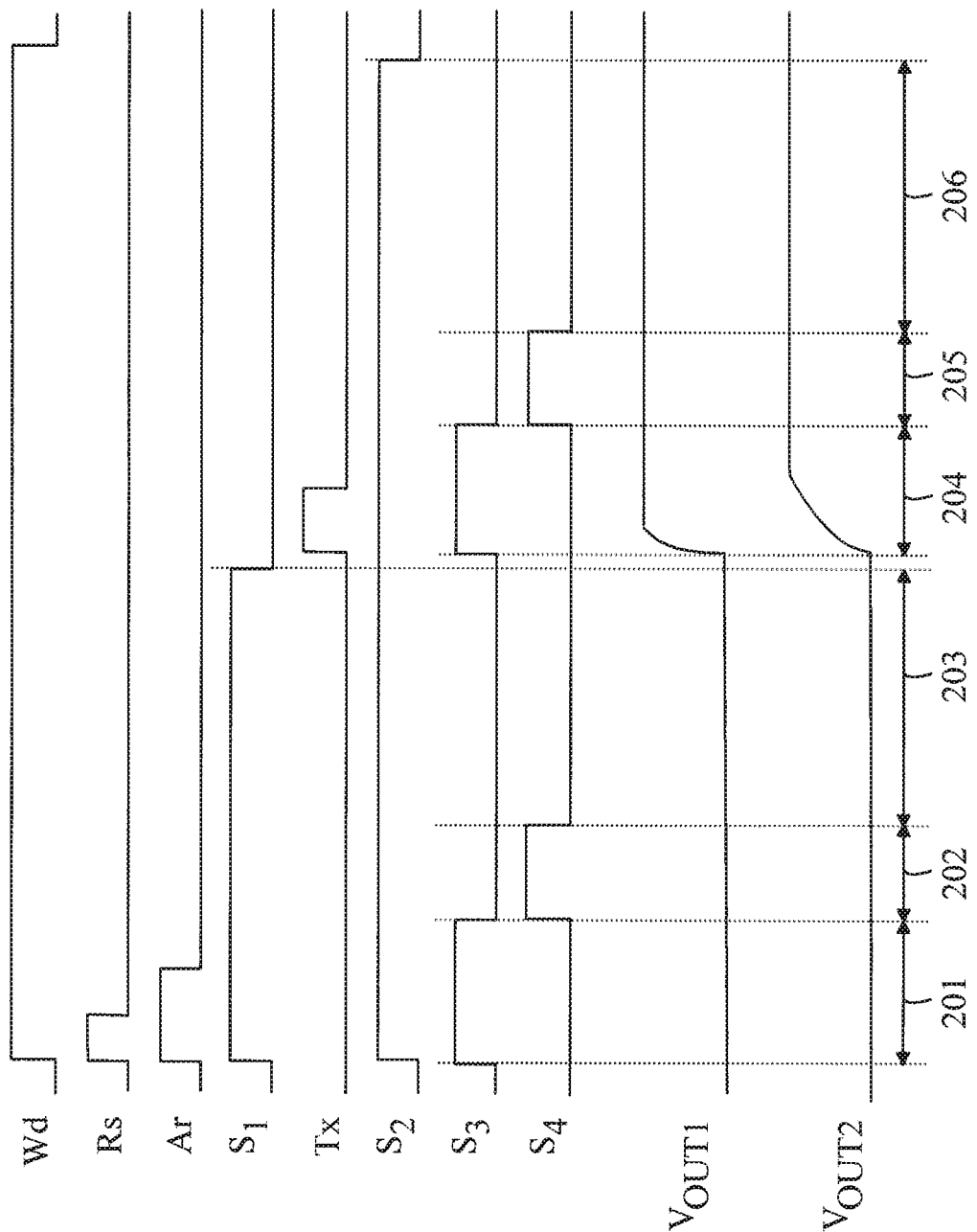
FIG. 6 illustrates a timing diagram for the readout scheme in a correlated double sampling imaging array using the column amplifier arrangement shown in FIG. 5.

A timing diagram for the readout scheme in a correlated double sampling imaging array using the column amplifier arrangement shown in FIG. 5 is shown in FIG. 6. As noted above, in a correlated double sampling scheme, the voltage on the floating diffusion node 25 is reset to $V_R$ by raising reset signal Rs. The voltage after reset is captured on capacitor 42. The charge on the photodiode is then transferred to floating diffusion node 25 and the voltage on floating diffusion node 25 is captured on capacitor 43. The difference in the captured voltages is a measure of the photocharge that was stored on photodiode 26. Each of these voltage capture steps can be viewed as taking place in two phases. In the first phase, capacitor 144 is charged to a voltage that is close to that of the output of amplifier 35 by buffer 154. In the second phase, noise and the remaining discrepancy between the voltage on the output of amplifier 35 and capacitor 144 are removed by disconnecting buffer 154 and connecting capacitor 144 to the output of amplifier 35 via the low bandwidth path through switch 151.

Switches 46 and 47 are controlled by signals $S_1$ and $S_2$, each switch being closed by the corresponding signal going HIGH. Switches 152, 153 and 156 are controlled by a signal $S_3$. Switches 152 and 153 are closed by $S_3$ going HIGH, and switch 156 is closed by $S_3$ going LOW. Switch 151 is closed by signal $S_4$ going HIGH. In a correlated double sampling scheme, the voltage on the floating diffusion node 25 is reset to $V_R$ by raising reset signal Rs. The voltage after reset is captured on capacitor 42. This measurement is accomplished in three phases, as discussed above.

In phase 201, the buffer 154 is activated and used to precharge capacitor 144. The period is set by closing switches 152 and 153. As noted above, this period is characterized by a high level of noise. At the end of the first period, switches 152 and 153 are opened and switches 151 and 156 are closed. This starts phase 202 during which any offset is removed from capacitor 144. At the end of phase 202, switch 151 is opened by setting $S_4$ LOW leaving switch 156 still closed. During phase 203, the voltage on capacitor 144 settles to the desired low noise state. At the end phase 203, this voltage is captured on capacitor 42.

The capture of the voltage on floating diffusion node 25 after the charge on photodiode 26 is transferred proceeds in three analogous phases, referred to as phases 204-206. Phase 204 starts with the transfer of the photocharge to floating diffusion node 25 by pulsing Tx HIGH. Phases 204-206 are analogous to phases 201-203 discussed above, and hence, will not be discussed in detail. At the end of phase 206, switch 47 is opened, thus capturing the second voltage level on capacitor 43.

Figure 7:
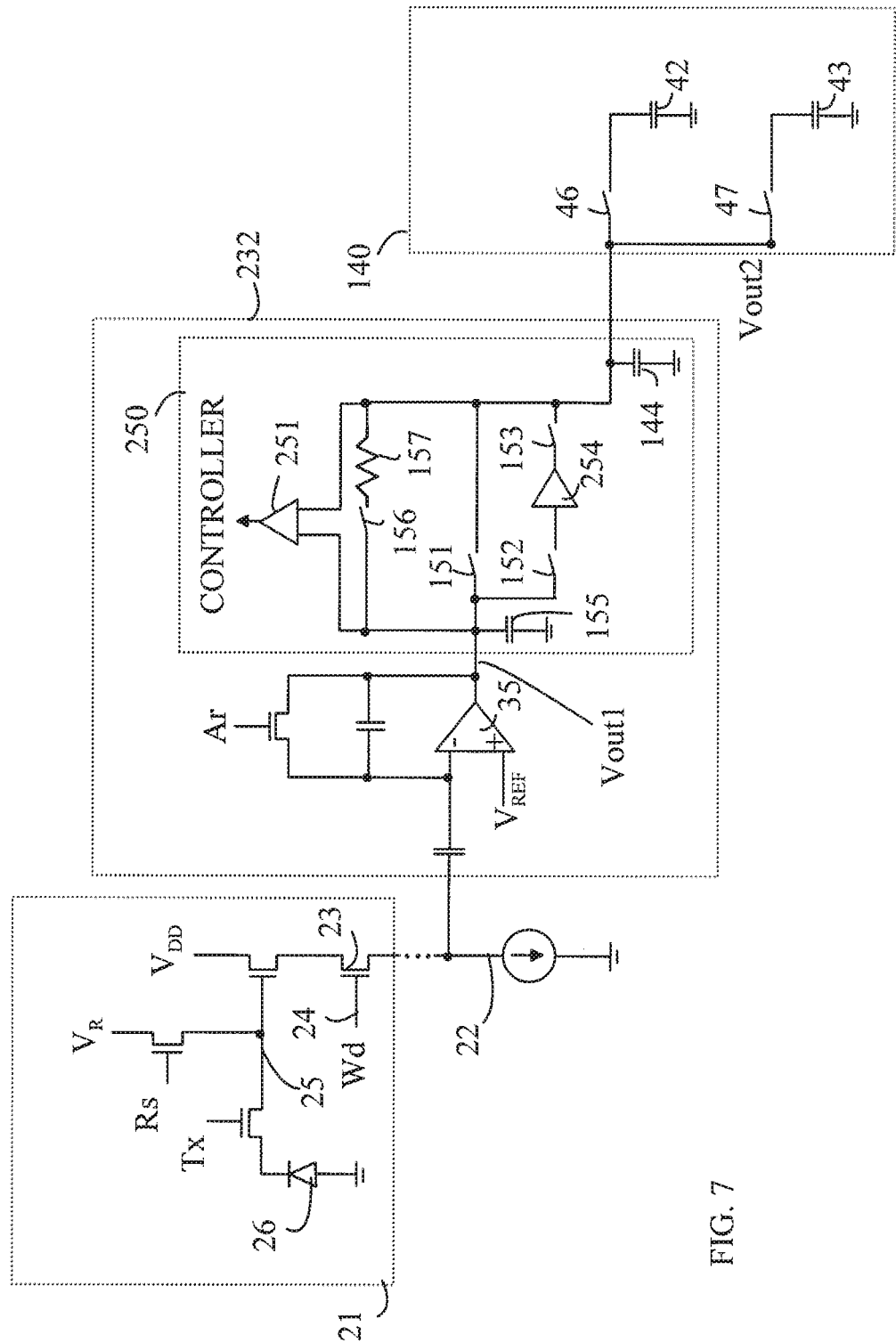
FIG. 7 illustrates an embodiment of the present invention that utilizes a higher gain amplifier to accelerate the charging of the filter capacitor.

In the above-described embodiments, a unit gain buffer amplifier is used to accelerate the charge rate of the filter capacitor during the first phase of the readout. However, embodiments in which a higher gain factor is utilized together with a comparator to accelerate the charging of the filter capacitor can also be constructed. Refer now to FIG. 7, which illustrates an embodiment of the present invention that utilizes a higher gain amplifier to accelerate the charging of the filter capacitor. To simplify the following discussion, those elements of column readout amplifier 232 that provide functions analogous to functions discussed above with respect to FIG. 5, have been given the same numeric designations and will not be discussed in detail here. In column readout amplifier 232, amplifier 254 charges filter capacitor 144 during the first phase of the readout operation. The gain of amplifier 254 is greater than one to further accelerate the initial charging of filter capacitor 144. A comparator 251 monitors the voltage difference between $V_{out1}$ and $V_{out2}$. When the monitored voltage difference is less than a predetermined threshold value, controller 250 changes the state of the $S_3$ signal to move the system into the second phase of the charging cycle. The remainder of the voltage measurement remains the same as that discussed above with respect to FIG. 5. The shortening of the first phase can be used to reduce the overall readout time or to increase the settling time in the third phase. In motion picture applications, the overall readout time determines the maximum frame rate, and hence, the shortened readout time allows a higher frame rate with improved noise.

The above-described embodiments depend on four capacitors, namely capacitors 155, 144, 42, and 43. In general, the capacitance of capacitor 144 is chosen to be much greater than that of the remaining three capacitors. In one exemplary embodiment, capacitor 144 is at least five times larger than the other three capacitors. For example, in one embodiment, the capacitance of capacitor 144 is 20 pF, while the capacitance of capacitors 155, 42, and 43 are 0.5 pF, 1 pF and 1 pF, respectively.

The sizes of resistor 157 and capacitor 144 determine the RC filter time constant for the final charging path for capacitor 144. In one exemplary embodiment, this RC time constant is set to be greater than 24 microseconds.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
a signal amplifier having an amplifier signal output;
a first filter capacitor;
a buffer amplifier having a buffer amplifier input and a buffer amplifier output; and
a switching network,
wherein said first filter capacitor has first and second terminals, said second terminal being connected to a power rail, and said switching network connects said amplifier signal output to said buffer amplifier input by a first direct current path and said buffer amplifier output to said first terminal of said first filter capacitor by a second direct current path during a first time period, connects said amplifier signal output directly to said first terminal of said first filter capacitor by a third direct current path during a second time period, and connects said amplifier signal output to said first terminal of said first filter capacitor through a resistor during a third time period.

2. The apparatus of claim 1 wherein said first time period precedes said second time period and said second time period precedes said third time period.

3. The apparatus of claim 1 wherein said buffer amplifier has a gain substantially equal to one.

4. The apparatus of claim 1, wherein said apparatus further comprises a controller that measures a difference between said buffer amplifier input and buffer amplifier output, said controller causing said apparatus to switch from said first time period to said second time period when said difference is less than a predetermined threshold.

5. The apparatus of claim 1 wherein said first time period and said second time period are fixed.

6. The apparatus of claim 1 wherein said buffer amplifier output is disconnected from said first filter capacitor during said second time period and said third time period.

7. The apparatus of claim 1 wherein said signal amplifier comprises a capacitive transimpedance amplifier with a gain greater than one.

8. An imaging array comprising:
a readout line conductor;
a plurality of pixel sensors, each pixel sensor being coupled to said readout line conductor in response to a word select signal;
a column amplifier connected to said readout line conductor, said column amplifier comprising:
a signal amplifier having an amplifier signal output;
a first filter capacitor;
a buffer amplifier having a buffer amplifier input and a buffer amplifier output; and
a switching network,
wherein said first filter capacitor has first and second terminals, said second terminal being connected to a power rail, and said switching network connects said amplifier signal output to said buffer amplifier input by a first direct current path and said buffer amplifier output to said first terminal of said first filter capacitor by a second direct current path during a first time period, connects said amplifier signal output directly to said first terminal of said first filter capacitor by a third direct current path during a second time period, and connects said amplifier signal output to said first terminal of said first filter capacitor through a resistor during a third time period.

9. The apparatus of claim 8 wherein said first time period precedes said second time period and said second time period precedes said third time period.

10. The apparatus of claim 8 wherein said buffer amplifier has a gain substantially equal to one.

11. The apparatus of claim 8, wherein said imaging array further comprises a controller that measures a difference between said buffer amplifier input and buffer amplifier output, said controller causing said apparatus to switch from said first time period to said second time period when said difference is less than a predetermined threshold.

12. The apparatus of claim 11 wherein said buffer amplifier has a gain greater than one.

13. The apparatus of claim 8 wherein said first time period and said second time period are fixed.

14. The apparatus of claim 8 wherein said buffer amplifier output is disconnected from said first filter capacitor during said second time period and said third time period.

15. The apparatus of claim 8 wherein said signal amplifier comprises a capacitive transimpedance amplifier with a gain greater than one.

\* \* \* \* \*